(12) United States Patent
Nishiwaki

(10) Patent No.: US 11,094,505 B2
(45) Date of Patent: Aug. 17, 2021

(54) SUBSTRATE PROCESSING APPARATUS, STORAGE MEDIUM AND SUBSTRATE PROCESSING METHOD

(71) Applicant: ASM IP Holding B.V., Almere (NL)

(72) Inventor: Kazuhiro Nishiwaki, Tama (JP)

(73) Assignee: ASM IP Holding B.V., Almere (NL)

( * ) Notice: Subject to any disclaimer, the term of this patent is extended or adjusted under 35 U.S.C. 154(b) by 206 days.

(21) Appl. No.: 15/644,535

(22) Filed: Jul. 7, 2017

(65) Prior Publication Data

US 2019/0013181 A1 Jan. 10, 2019

(51) Int. Cl.
*H01J 37/32* (2006.01)
*H04B 1/04* (2006.01)

(52) U.S. Cl.
CPC .. *H01J 37/32082* (2013.01); *H01J 37/32917* (2013.01); *H01J 2237/33* (2013.01); *H04B 1/04* (2013.01)

(58) Field of Classification Search
None
See application file for complete search history.

(56) References Cited

U.S. PATENT DOCUMENTS

| | | | |
|---|---|---|---|
| 6,459,067 B1 * | 10/2002 | Vona, Jr. | H01J 37/32082 219/121.43 |
| 6,700,092 B2 | 3/2004 | Vona, Jr. et al. | |
| 8,790,743 B1 * | 7/2014 | Omori | C23C 16/45536 427/8 |
| 9,070,537 B2 | 6/2015 | Yuzurihara et al. | |
| 2002/0123237 A1 * | 9/2002 | Nguyen | H01J 37/32137 438/761 |
| 2018/0233876 A1 * | 8/2018 | Schulz | H01S 3/09702 |

FOREIGN PATENT DOCUMENTS

TW 201112887 A 4/2011
TW I558273 B 11/2016

OTHER PUBLICATIONS

"English translation" Office Action for TW Application No. 107113795, dated Apr. 14, 2021.

* cited by examiner

*Primary Examiner* — David P Turocy
(74) *Attorney, Agent, or Firm* — Dorsey & Whitney LLP

(57) ABSTRACT

Examples of a substrate processing apparatus include a signal transmitter that outputs a command signal, and an RF generator that receives the command signal, starts to output traveling wave power simultaneously with a first transition of the command signal, measures a delay time, which is a time period after the first transition of the command signal until a predetermined power-applied state is achieved on a receiving side of the traveling wave power, and stops outputting the traveling wave power when the delay time elapses after a second transition of the command signal.

12 Claims, 5 Drawing Sheets

US 11,094,505 B2

SUBSTRATE PROCESSING APPARATUS, STORAGE MEDIUM AND SUBSTRATE PROCESSING METHOD

BACKGROUND

Field

Examples are described which relate to a substrate processing apparatus, a storage medium and a substrate processing method.

Background Art

U.S. Pat. No. 8,790,743 discloses a method for processing a substrate in a reactor by pulsing RF power. This method includes applying RF power in pulses in the reactor to process the substrate, monitoring data from the reactor indicative of anomalous pulses of RF power, including data from a photo sensor equipped in the reactor, counting the number of anomalous pulses of RF power in the monitored data, determining whether or not the number of anomalous pulses of RF power is acceptable, and initiating a pre-designated sequence if the number of anomalous pulses of RF power is determined to be unacceptable.

SUMMARY

Some examples described herein may address the above-described problem. Some examples described herein may provide a substrate processing apparatus, a storage medium and a substrate processing method capable of accurately giving electric energy to a load for a period specified by a command signal.

In some examples, a substrate processing apparatus includes a signal transmitter that outputs a command signal, and an RF generator that receives the command signal, starts to output traveling wave power simultaneously with a rise of the command signal, measures a delay time, which is a time period after the rise of the command signal until a predetermined power-applied state is achieved on a receiving side of the traveling wave power, and stops outputting the traveling wave power when the delay time elapses after a fall of the command signal.

In some examples, a computer-readable storage medium is provided that encodes a program, the program causing a computer to execute receiving a command signal and starting to output traveling wave power simultaneously with a rise of the command signal, measuring a delay time, which is a time period after the rise of the command signal until a predetermined power-applied state is achieved on a receiving side of the traveling wave power, and stopping outputting the traveling wave power when the delay time elapses after a fall of the command signal.

In some examples, a substrate processing method includes receiving a command signal, which is a rectangular wave and starting to output traveling wave power simultaneously with a rise of the command signal, measuring a delay time, which is a time period after the rise of the command signal until a predetermined power-applied state is achieved on a receiving side of the traveling wave power, and stopping outputting the traveling wave power when the delay time elapses after a fall of the command signal.

DETAILED DESCRIPTION

Figure 1:
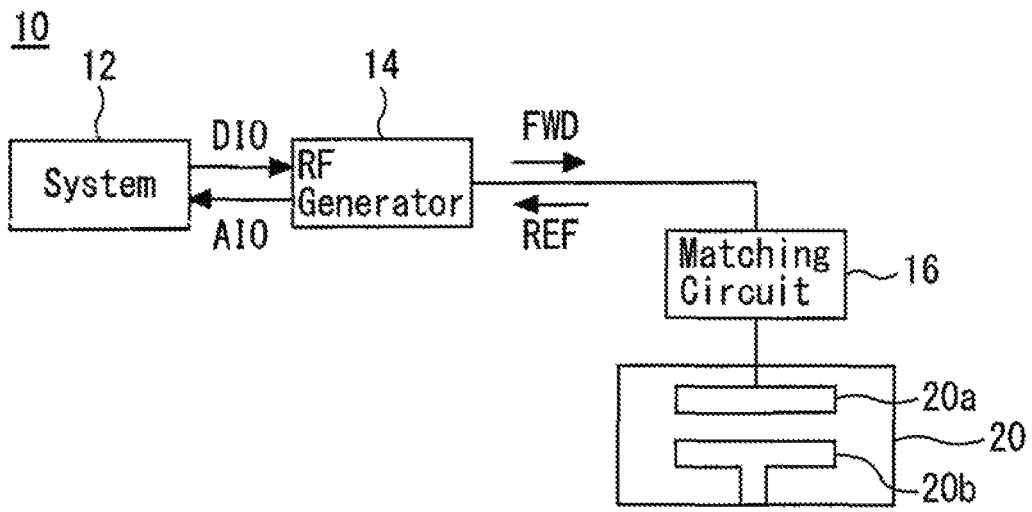
FIG. 1 is a block diagram of a substrate processing apparatus according to some examples described herein.

RF generators receive a command signal from a signal transmitter, output high frequency power and process a substrate using the high frequency power. A time period during which such an RP generator outputs the high frequency power is determined by a time period specified by a command signal set and managed by a recipe. The RF generator preferably outputs the high frequency power completely synchronized with the command signal outputted from the signal transmitter. In other words, predetermined electric energy is preferably accurately given to a load for a period specified by the command signal. However, a delay time is generated after the RF generator receives the command signal until the predetermined electric energy is given to the load. Such a delay time may cause a problem that the electric energy cannot be accurately given to the load for the period specified by the command signal.

A substrate processing apparatus, a storage medium and a substrate processing method according to an embodiment of the present invention will be described with reference to the accompanying drawings. The same or corresponding components will be assigned the same reference numerals and duplicate description may be omitted.

FIG. 1 is a block diagram of a substrate processing apparatus 10. The substrate processing apparatus 10 is provided with a signal transmitter 12 that outputs a command signal. The command signal refers to, for example, a signal for commanding a period during which electric energy is given to a load based on, for example, a recipe. The command signal can be a rectangular wave.

The substrate processing apparatus 10 is provided with an RF generator 14 that communicates with the signal transmitter 12. The RF generator 14 receives the command signal outputted from the signal transmitter 12, and outputs traveling wave power synchronized with the command signal. Signals are exchanged between the signal transmitter 12 and the RF generator 14 via digital input/output or analog input/output.

A matching circuit 16 is connected to the RF generator 14. An upper electrode 20a of a reactor 20 is connected to the matching circuit 16. The reactor 20 is designed to give high frequency power to the upper electrode 20a, supply a gas between the upper electrode 20a and a lower electrode 20b and generate plasma to process a substrate on the lower electrode 20b. In some examples, the high frequency power is electric power having a frequency of 360 kHz minimum to 60 MHz maximum. High frequency power having a frequency of 360-500 kHz and high frequency power having a frequency of 12.06-60 MHz nay be applied to the upper electrode 20a simultaneously. Examples of processing on a substrate include film formation, etching, reforming of a film.

Figure 2:
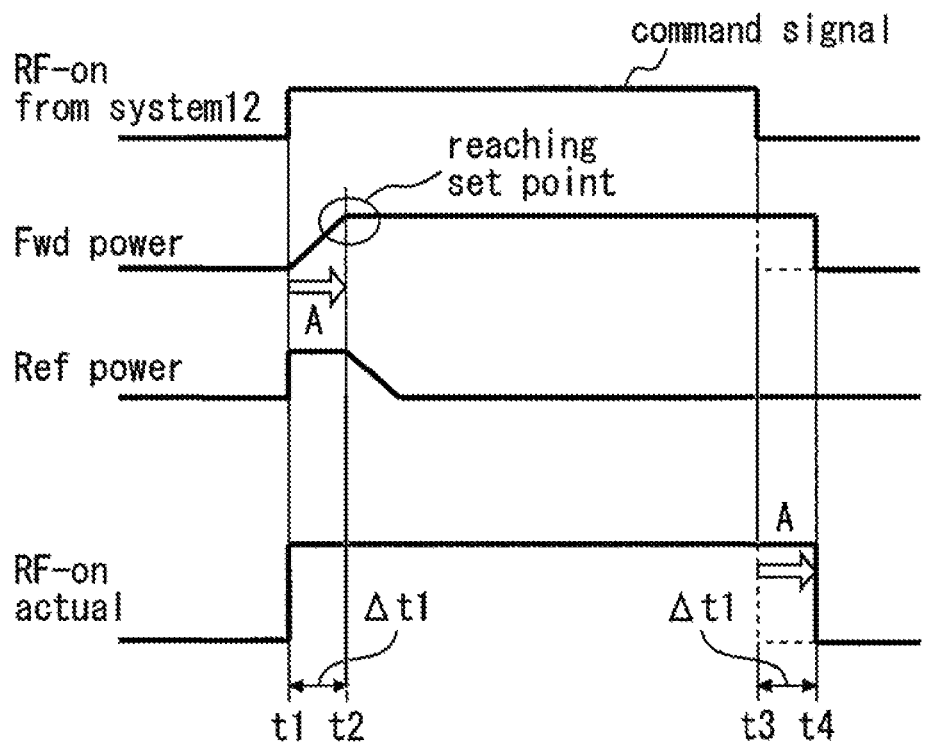
FIG. 2 is a waveform diagram illustrating a waveform or the like of high frequency power.

FIG. 2 is a waveform diagram illustrating a waveform or the like of high frequency power. RF-on from system 12 is a command signal transmitted from the signal transmitter 12 to the RF generator 14. Fwd power is the power of a traveling wave outputted from the RF generator 14. Ref power is the power of a reflected wave that returns to the RF generator 14. RF-on actual is a period represented by a rectangular wave during which the RF generator 14 outputs high frequency power.

At time t1, a command signal is outputted from the signal transmitter 12 to the RF generator 14, which causes the waveform of RF-on from system 12 to start a first transition to change from a first state to a second state (e.g., rise). While this first transition is described as a rise, in other examples, the transition may be a fall from a first state to a second state (e.g., from a first logical state to a second logical state). The RF generator 14 starts outputting traveling wave power simultaneously with the first transition of the command signal. Therefore, when the command signal is outputted at time t1, the RF generator 14 outputs the high frequency power, and traveling wave power is generated. However, since the initial traveling wave power is small, it takes some time before reaching a predetermined power level. That is, a certain period of time is required until the traveling wave power is stabilized.

It is time t2 at which the traveling wave power is stabilized. The traveling wave power continues to change (e.g., rise) for a period from time t1 to time t2, and is then stabilized to a constant value. The delay after the traveling wave power is generated until it is stabilized is a primary delay. In FIG. 2, the time required for the traveling wave power to become stable is expressed by $\Delta t1$. $\Delta t1$ is a time period from the first transition of the command signal until the traveling wave power reaches a predetermined reference value. $\Delta t1$ is called a "delay time."

The RF generator 14 measures this delay time $\Delta t1$. That is, the RF generator 14 measures the time period after time t1 at which the first transition of the command signal is detected until time t2 at which the traveling wave power reaches the predetermined reference value. For example, the RF generator 14 may be provided with a power sensor and it is possible to measure the traveling wave power using the power sensor and thereby identify time t2.

Since circuit matching is not achieved for the period from time t1 to time t2, relatively large reflected wave power is generated. Time t2 to time t3 is a period during which the traveling wave power that reaches the reference value is stably supplied to the matching circuit 16. Almost no reflected wave power is generated during this period, and predetermined electric energy is given to the upper electrode 20a. Therefore, sufficient plasma is formed between the upper electrode 20a and the lower electrode 20b, and processing on a substrate is performed. The period from time t2 to time t3 is, for example, 650 msec.

When time t3 is reached, a second transition of the command signal from the second state to the first state (e.g. fall) occurs. While the second transition is described as a fall, in other examples, the second transition may be a rise from the second state to the first state (e.g., from one logical state to another logical state). Since the period from time t1 to time t3 is, for example, 700 msec, the command signal is intended to give electric energy to the load over a period of 700 msec. However, since the traveling wave power does not reach the reference value during the delay time $\Delta t1$, it is a period of 650 msec up until time t3 that is a period during which sufficient electric energy is given to the load. Such a period may not be enough to realize the processing defined in the recipe.

Therefore, in some examples, the RF generator 14 does not stop outputting the traveling wave power immediately after the second transition of the command signal, but stops outputting the traveling wave power only when the delay time $\Delta t1$ elapses after the second transition of the command signal. That is, the RF generator 14 extends the command signal by the calculated delay time $\Delta t1$ and outputs the traveling wave power. A period from time t3 to t4 is a period during which although the second transition of the command signal occurs, the RF generator 14 continues to output the traveling wave power. The period from time t3 to t4 is equal to the delay time $\Delta t1$. By so doing, it is possible to supply sufficient electric energy to the load for 700 msec and thereby meet the request of the command signal.

Thus, by measuring the delay time $\Delta t1$ which is a period during which sufficient electric energy cannot be given after the first transition of the command signal and extending the output of the traveling wave power by the delay time $\Delta t1$ after the second transition of the command signal, it is possible to give electric energy to the load accurately for the period specified by the command signal.

When one command signal is transmitted to the RF generator 14, the output time period of the traveling wave power is extended as described above, and when the next command signal is transmitted to the RF generator 14, similar processing is performed. Since the delay time fluctuates depending on an operation situation of the RF generator 14, it is preferable to measure a delay time every time a command signal is transmitted to the RF generator 14 and use a latest delay time. However, when it is possible to determine that the delay time generally remains fixed over a certain period of time, the measured delay time may also be used for the next command signal.

When the command signal is assumed to be a rectangular wave, the command signal shown in FIG. 2 is repeatedly supplied in a constant cycle. When the delay time $\Delta t1$ increases, the RF generator 14 may receive a second command signal before the output of traveling wave power corresponding to the first command signal ends. To avoid such a situation, in some examples, an upper limit to the delay time $\Delta t1$ may be set.

Figure 3:
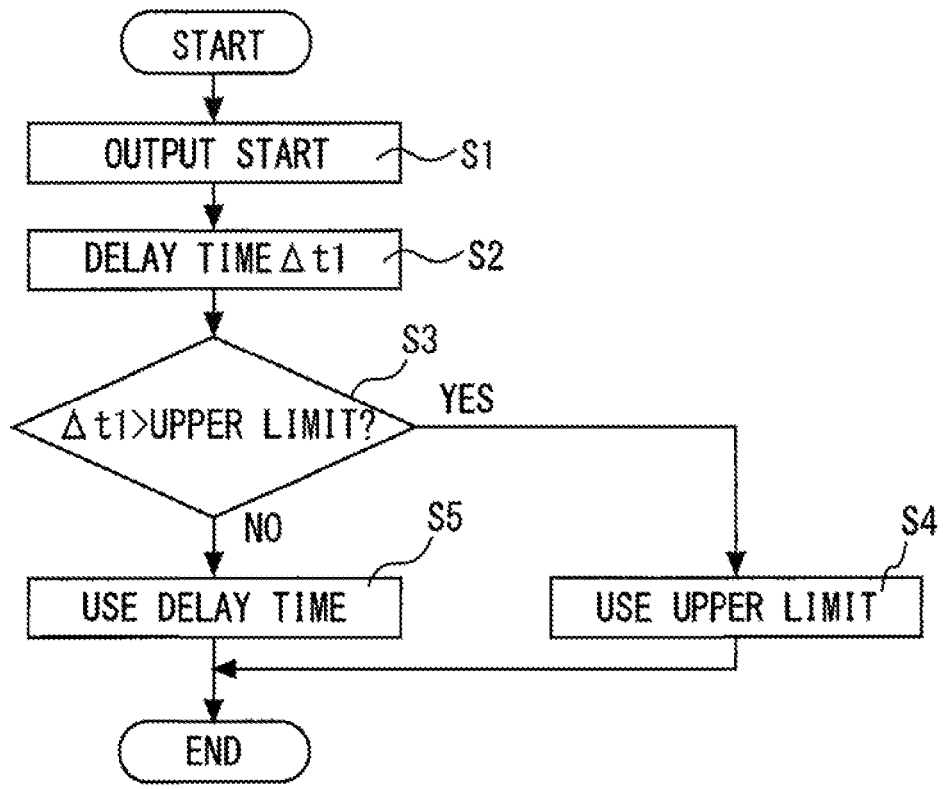
FIG. 3 is a flowchart showing a flow of substrate processing.

The output of the traveling wave power using the upper limit will be described with reference to a flowchart in FIG. 3. First, in step S1, the RF generator 14 receives a command signal and starts outputting traveling wave power simultaneously with a first transition (e.g., rise) of the command signal. This step is called an "output start step."

Next, the process proceeds to step S2. In step S2, the delay time is measured. As described above, the delay time $\Delta t1$ is a time period after the first transition of the command signal until the traveling wave power reaches a predetermined reference value. The step in which the delay time $\Delta t1$ is measured is called a "measuring step."

Next, the process proceeds to step S3. It is determined in step S3 whether or not the delay time $\Delta t1$ measured in the RF generator 14 is greater than an upper limit. In some examples, data of the upper limit may be stored in a memory of the RF generator 14 in advance. The upper limit is a period shorter than the period from the second transition of a certain command signal to the first transition of the next command signal. The step of comparing delay time Δt1 with a predetermined upper limit is called a "comparison step."

When the delay time Δt1 is greater than the upper limit, the process proceeds to step S4. When it is determined in the comparison step that the delay time Δt1 is greater than the upper limit, the RF generator 14 stops outputting the traveling wave power when the upper limit elapses after the second transition of the command signal. The step of stopping outputting the traveling wave power is called a "stopping step." By using the upper limit, it is possible to start outputting the traveling wave power simultaneously with the first transition of the next command signal.

On the other hand, when it is determined in the comparison step that the delay time Δt1 is smaller than the upper limit, the process proceeds to step S5. In step S5, when the delay time Δt1 elapses after the second transition of the command signal, the RF generator 14 stops outputting the traveling wave power. This may make it possible to accurately supply electric energy for the period specified by the command signal. Note that steps S4 and S5 can be omitted, for example, when the upper limit is unnecessary.

Here, a configuration for implementing the function of the RF generator 14 will be described. The RF generator 14 receives a command signal through a receiver. The traveling wave power is outputted by an emitter. Measurement and use of a delay time are realized by processing circuitry. That is, the RF generator 14 is provided with processing circuitry for receiving a command signal, starting to output traveling wave power simultaneously with the first transition of the command signal, measuring a delay time, comparing the delay time with a predetermined upper limit, and stopping outputting the traveling wave power when a delay time or an upper limit elapses after a second transition of the command signal. The processing circuitry may be dedicated hardware or a CPU (also called "central processing unit," "processing apparatus," "calculation apparatus," "microprocessor," "microcomputer," "processor" or "DSP") that executes a program stored in a memory.

Figure 4:
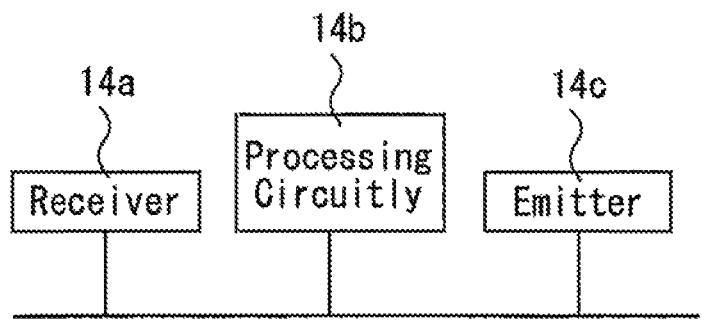
FIG. 4 shows an example configuration of an RF generator.

FIG. 4 is a block diagram of the RF generator 14 when processing circuitry 14b is dedicated hardware. The RF generator 14 is provided with a receiver 14a, processing circuitry 14b and an emitter 14c. The processing circuitry 14b corresponds to a single circuit, a composite circuit, a programmed processor, a parallel programmed processor, an ASIC, an FPGA or a combination of these units. Each function of the RF generator 14 may be implemented by each processing circuitry 14b or the respective functions may be collectively implemented by the processing circuitry 14b.

Figure 5:
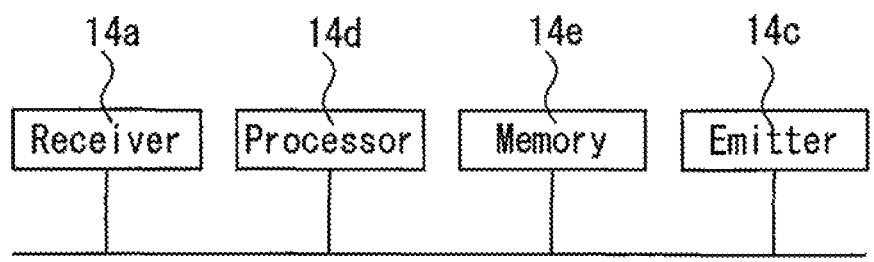
FIG. 5 shows another example configuration of an RF generator.

FIG. 5 is a block diagram of the RF generator 14 when the processing circuitry is a CPU. In this case, the above-described series of processes are controlled by a program. That is, the flow in FIG. 3 is automatically executed. When a processor 14d is a CPU as shown in FIG. 5, the respective functions of the RF generator 14 are implemented by software, firmware or a combination of software and firmware. Software or firmware is written as a program and stored in a computer-readable memory 14e. In short, this program causes a computer to execute starting to output traveling wave power simultaneously with a first transition of a command signal, measuring a delay time, which is a time period after the first transition of the command signal until the traveling wave power reaches a predetermined reference value, and stopping outputting the traveling wave power when the delay time elapses after a second transition of the command signal.

The memory 14e may correspond to a non-volatile or volatile semiconductor memory such as RAM, ROM, flash memory, EPROM, EEPROM, or magnetic disk, flexible disk, optical disk, compact disk, mini-disk, DVD and so on. The processor 14d implements the above-described respective functions by reading and executing the program stored in the memory 14e. The memory 14e may store the measured delay time. The processor 14d which is a CPU reads the delay time stored in the memory 14e and extends the output period of the traveling wave power by an amount corresponding to the delay time. The delay time stored in the memory may be used for a plurality of command signals or a delay time may be calculated every time a command signal is received.

Naturally, a part of the RF generator 14 may be implemented by dedicated hardware and another part may be implemented by software or firmware.

The substrate processing apparatus, the storage medium and the substrate processing method according to the first embodiment can be modified in a range without losing the features thereof. For example, the delay time Δt1 is not necessarily calculated by above-described calculation method. In the first embodiment, the end time of the delay time Δt1 is assumed to be a time point at which the traveling wave power reaches a predetermined reference value. However, the delay time can be generalized as a "time period after a first transition of a command signal until a predetermined power-applied state is realized on a traveling wave power receiving side." That is, the delay time is a period starting from a first transition of a command signal during which predetermined electric energy should have been given to the load but has not actually been given. Therefore, the end time of the delay time Δt1 is not limited to a time point at which the traveling wave power reaches a predetermined reference value, but can be defined as a time point at which the predetermined power-applied state is realized on the traveling wave power receiving side. Other delay time setting methods will be further described herein.

Techniques described herein may be developed for various substrate processing apparatuses required to increase the level of consistency between a command signal and actual control. The techniques and components described with reference to FIG. 1-FIG. 5 may be applicable to a substrate processing apparatus, a storage medium and a substrate processing method according to other embodiments described herein. Note that since the substrate processing apparatus, the storage medium and the substrate processing method according to other embodiments may include many points common to those of the embodiments described with reference to FIG. 1-FIG. 5, they will be described focusing on differences from what has already been described.

Figure 6:
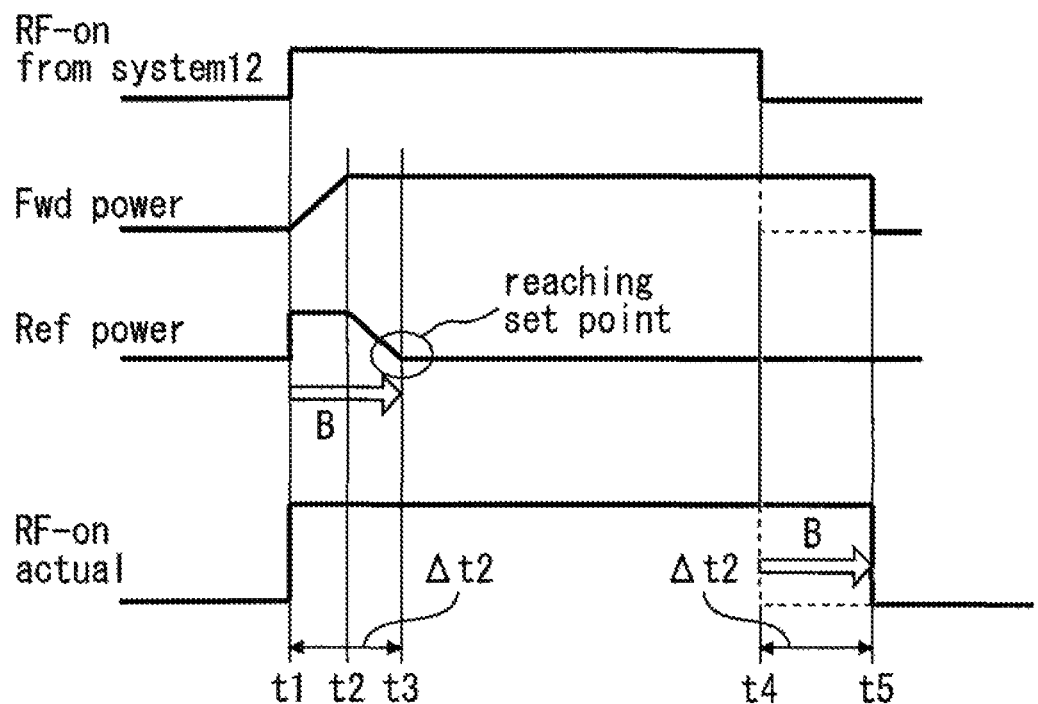
FIG. 6 is a waveform diagram illustrating operation of a substrate processing apparatus according to a second embodiment.

FIG. 6 is a waveform diagram illustrating operation of a substrate processing apparatus according to some examples. In the example of FIG. 6, it is assumed a time period after a first transition of a command signal until reflected wave power to the RF generator 14 falls below a predetermined reference value as a delay time. That is, a period from time t1 to t3 in FIG. 6 is assumed to be a delay time Δt2. Time t3 is a time at which the reflected wave power falls below a predetermined reference value.

When impedance matching is completed, the reflected wave power theoretically becomes 0. However, even when impedance matching is completely achieved, reflected wave power of several watts may be detected. Therefore, instead of 0 W, it is preferable to set a sufficiently low value on the order of, for example, 2 W as the reference value. The reflected wave power may be monitored using a power sensor provided in the RF generator 14 and a time period after a first transition of a command signal until the reflected wave power falls below 2 W may be assumed as a delay time. When the delay time Δt2 elapses after a second transition of the command signal, the RF generator 14 stops outputting the traveling wave power.

In this way, it is possible to give electric energy to the load accurately for a period specified by the command signal, and increase the level of consistency between the process described in the recipe and actual control.

Figure 7:
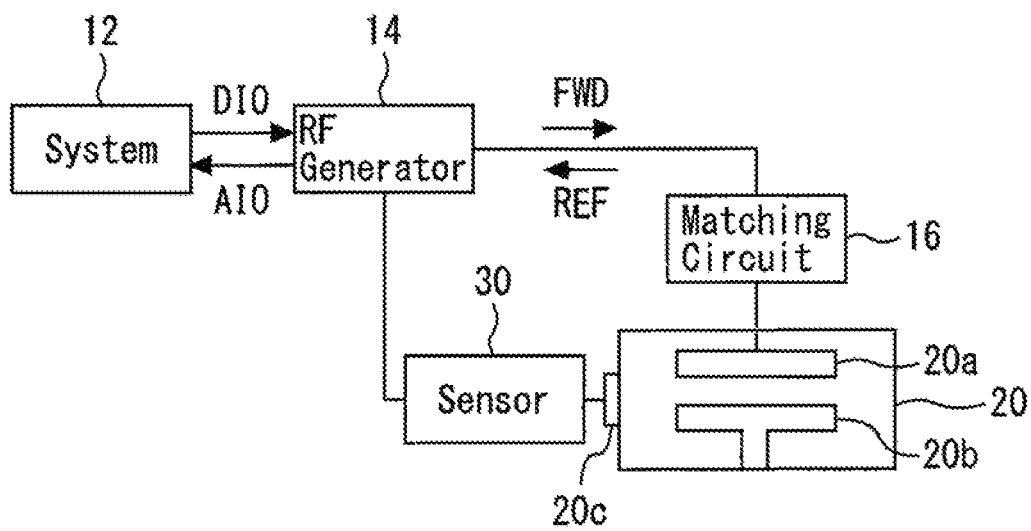
FIG. 7 is a block diagram illustrating a configuration of a substrate processing apparatus according to some examples described herein.

FIG. 7 is a block diagram illustrating a configuration of a substrate processing apparatus according to some examples. This substrate processing apparatus is provided with the reactor 20 that receives traveling wave power via the matching circuit 16 and generates plasma. The reactor 20 is provided with a view port 20c to allow the interior thereof to be observed. A sensor 30 is provided outside the reactor 20. The sensor 30 receives plasma light generated by plasma in the reactor via the view port 20c. The sensor 30 converts the received light to an analog voltage. Therefore, the sensor 30 can convert the plasma light in the reactor 20 to an electric signal. This electric signal is supplied to the RF generator 14.

Figure 8:
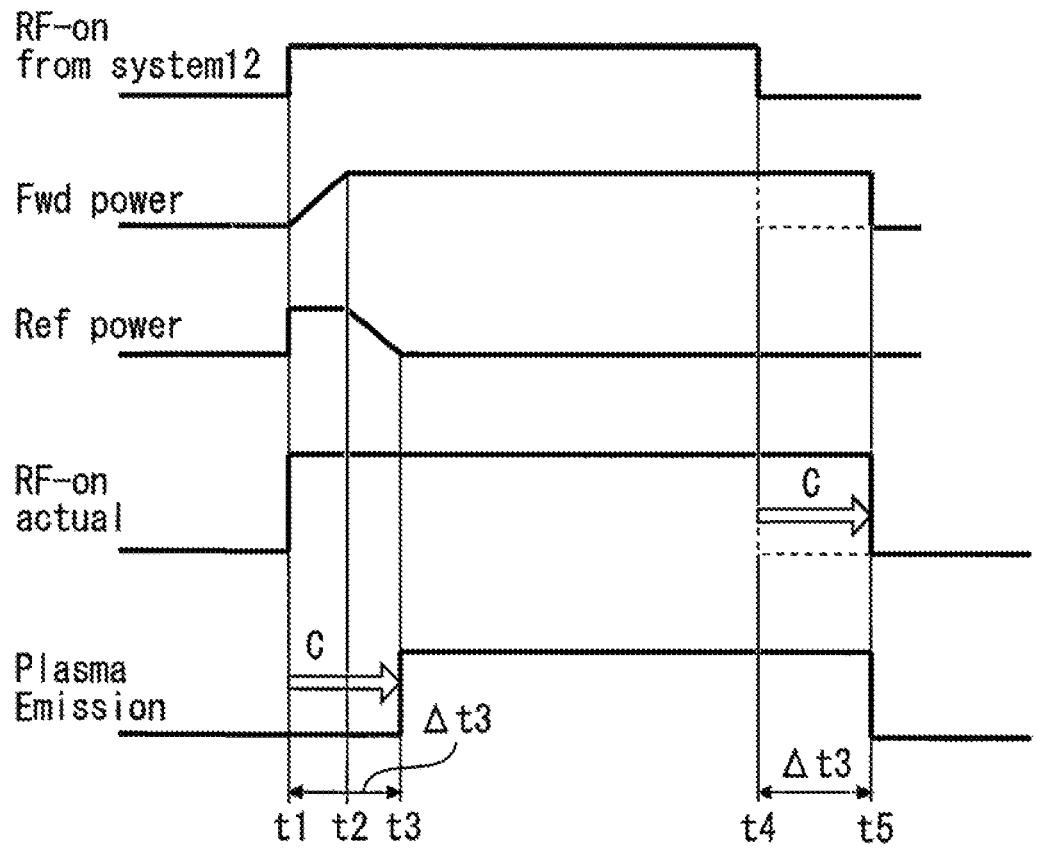
FIG. 8 is a waveform diagram illustrating operation of the substrate processing apparatus according to some examples described herein.

FIG. 8 is a waveform diagram illustrating operation of the substrate processing apparatus according to some examples. The waveform at the bottom represents plasma emission intensity. At time t3, reflected wave power substantially falls to 0 and sufficient electric energy is supplied to the upper electrode 20a of the reactor 20. At time t3, the plasma emission intensity exceeds a predetermined light output level. Thus, an electric signal exceeding a predetermined level is supplied from the sensor 30 to the RF generator 14. The RF generator 14 measures a time period after a first transition of a command signal until the magnitude of this electric signal reaches a predetermined reference value as a delay time. FIG. 8 shows a delay time Δt3.

By measuring a time point when the emission intensity of plasma exceeds a predetermined light output level as an end time of the delay time, it is possible to cause the period specified by a command signal to coincide with the actual electric energy supply period. It may be advantageous to reflect the plasma state in a determination of the delay time. The plasma emission intensity has been used as an example of the plasma state, but, for example, plasma discharge can be reflected in the determination of an end time of the delay time.

Figure 9:
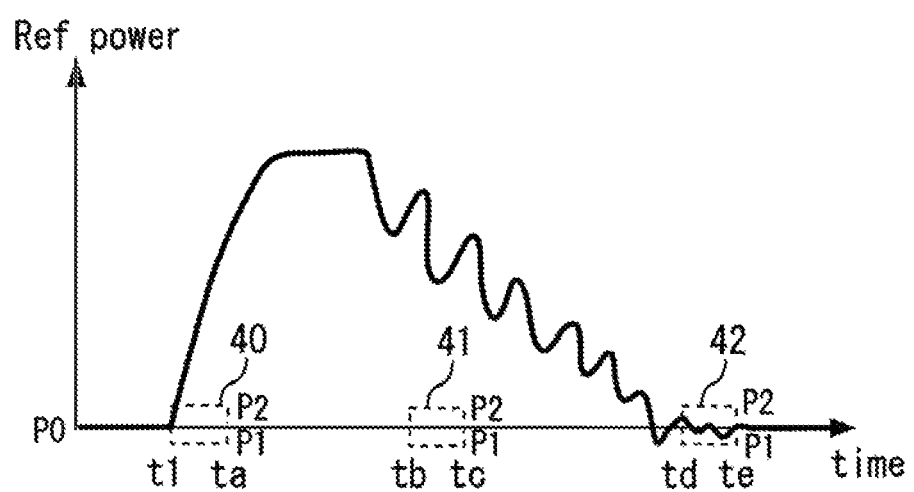
FIG. 9 shows a method of measuring the delay time according to some examples described herein.

A substrate processing apparatus, a storage medium and a substrate processing method according to additional examples may provide increased accuracy of measuring a delay time. FIG. 9 is a partially enlarged view of a waveform of reflected wave power. When an end time of a delay time is determined based on the reflected wave power, it is necessary to detect timing at which the reflected wave power to the RF generator 14 falls below a predetermined reference value as described with reference to FIG. 6. This timing becomes an end time of the delay time. However, when the reflected wave power is fluctuating, the accuracy of detecting timing at which the reflected wave power falls below the reference value deteriorates.

Thus, some examples use a window that defines an upper limit and a lower limit of the reference value during a predetermined period. In FIG. 9, windows 40, 41 and 42 are shown by broken lines. The window 40 is intended to determine whether or not the reflected wave power remains between P1 and P2 for a time period from time t1 to ta. P1 and P2 are, for example, −2 W and 2 W. The window 41 is intended to determine whether or not the reflected wave power remains between P1 and P2 for a time period from time tb to tc. The window 42 is intended to determine whether or not the reflected wave power remains between P1 and P2 for a time period from time td to te. Windows identical to the window 40 are arranged side by side without gaps between the windows 40 and 41, and windows identical to the window 40 are also arranged side by side without gaps between the windows 41 and 42. FIG. 9 illustrates only the three windows 40, 41 and 42 that represent these windows. One window has a time width of several msec, for example.

Detection of an end time of a delay time by the window 40 starts at time t1, which is a time at which a first transition of a command signal occurs. Since the waveform of the reflected wave power exists outside the window 40, it is determined that the period from time t1 to ta does not correspond to the end time of the delay time. Determinations will also be made sequentially on subsequent windows including the window 41.

In a determination made regarding the window 42, the waveform of the reflected wave power remains between P1 and P2 for the period from time td to te. When the time reaches time te, the RF generator 14 determines that the reflected wave power falls below the reference value over a predetermined period, and designates time td, which is a start time of the predetermined period as an end time of the delay time. In this example, the time period from time t1 at which the first transition of the command signal occurs to time td is measured as the delay time.

Accordingly, in some examples the reflected wave power stably falls below a reference value over a period corresponding to the width of the window before designating the start point of the window as an end time of the delay time, and can thereby accurately measure the delay time. This may make it possible in some examples to avoid erroneous detection of transient behavior of the reflected wave power. Note that such processing may be performed by the RF generator 14.

Such a method of detecting an end time of a delay time using a window can also be used to measure delay times of other examples described herein. In examples described with reference to FIG. 1-FIG. 5, when the traveling wave power exceeds a reference value for a predetermined period, the RF generator 14 can designate the start time of the predetermined period as an end time of the delay time. In examples described with reference to FIG. 6, when the magnitude of an electric signal exceeds a reference value for a predetermined period, the RF generator 14 can designate the start time of the predetermined period as an end time of the delay time. It may also be possible to use the technical features of the substrate processing apparatus, the storage medium and the substrate processing method of the respective embodiments described herein in combination.

According to examples described herein, a delay time, which is a period during which sufficient electric energy cannot be given to a load, is measured and output of power of a traveling wave is extended by an amount corresponding to the delay time after a second transition of the command signal. This may make it possible in some examples to give electric energy to the load accurately for the period specified by the command signal.

Many modifications and variations are possible in the light of the above teachings. It is therefore to be understood that within the scope of the appended claims variations may be practiced otherwise than as specifically described.

What is claimed is:

1. A substrate processing apparatus comprising:
a signal transmitter that is configured to output a command signal; and
an RF generator comprising:
an emitter; and
a central processing unit (CPU) or programmable logic device coupled to the emitter and the signal transmitter, wherein the CPU or programmable logic device is configured to:
receive the command signal;
cause the emitter to output traveling wave power simultaneously with a first transition of the command signal from a first logic state to a second logic state;
measure a delay time, wherein the CPU or programmable logic device begins measuring the delay time after the first transition of the command signal and stops measuring the delay time when a predetermined power-applied state is achieved on a receiving side of the traveling wave power; and
cause the emitter to stop outputting the traveling wave power when a period of time equal to the delay time measured by the CPU or programmable logic device elapses after a second transition of the command signal from the second logic state to the first logic state.

2. The substrate processing apparatus according to claim 1, wherein the delay time is a time period after the first transition of the command signal until the traveling wave power reaches a predetermined reference value.

3. The substrate processing apparatus according to claim 2, wherein when the traveling wave power exceeds the predetermined reference value for a predetermined period, the CPU or programmable logic device is configured to designate a start time of the predetermined period as an end time of the delay time.

4. The substrate processing apparatus according to claim 1, wherein the delay time is a time period after the first transition of the command signal until reflected wave power to the RF generator falls below a predetermined reference value.

5. The substrate processing apparatus according to claim 4, wherein when the reflected wave power falls below the predetermined reference value for a predetermined period, the CPU or programmable logic device is configured to designate a start time of the predetermined period as an end time of the delay time.

6. The substrate processing apparatus according to claim 1, further comprising:
a reactor configured to receive the traveling wave power via a matching circuit and generate plasma; and
a sensor configured to convert light of the plasma to an electric signal,
wherein the delay time is a time period after the first transition of the command signal until a magnitude of the electric signal reaches a predetermined reference value.

7. The substrate processing apparatus according to claim 6, wherein when the magnitude of the electric signal exceeds the predetermined reference value for a predetermined period, the CPU or programmable logic device is configured to designate a start time of the predetermined period as an end time of the delay time.

8. The substrate processing apparatus according to claim 1,
wherein the command signal is a rectangular wave,
the CPU or programmable logic device is further configured to:
cause the emitter to stop outputting the traveling wave power when the measured delay time is shorter than an upper limit and when the delay time elapses after a second transition of the command signal, and
cause the emitter to stop outputting the traveling wave power when the measured delay time exceeds the upper limit and when the upper limit elapses after the second transition of the command signal.

9. The substrate processing apparatus according to claim 1, wherein the RF generator comprises a storage medium configured to store the delay time and the CPU or programmable logic device is further configured to read the delay time stored in the storage medium.

10. The substrate processing apparatus according to claim 9, wherein the CPU or programmable logic device is configured to use the delay time stored in the storage medium for a plurality of the command signals.

11. The substrate processing apparatus according to claim 2, wherein the CPU or programmable logic device is configured to calculate the delay time every time the command signal is received.

12. The substrate processing apparatus according to claim 1, wherein the first logic state is a low logic state and the second logic state is a high logic state.

* * * * *